(12) United States Patent
Levanon et al.

(10) Patent No.: US 8,048,609 B2
(45) Date of Patent: Nov. 1, 2011

(54) RADIATION-SENSITIVE COMPOSITIONS AND ELEMENTS CONTAINING POLY(VINYL HYDROXYARYL CARBOXYLIC ACID ESTER)S

(75) Inventors: Moshe Levanon, Ness-Ziona (IL); Georgy Bylina, Lod (IL); Vladimir Kampel, Sederot (IL); Larisa Postel, Ashdod (IL); Marina Rubin, Petah-Tikva (IL); Tanya Kurtser, Petach Tiqwa (IL)

(73) Assignee: Eastman Kodak Company, Rochester, NY (US)

( * ) Notice: Subject to any disclaimer, the term of this patent is extended or adjusted under 35 U.S.C. 154(b) by 489 days.

(21) Appl. No.: 12/339,469

(22) Filed: Dec. 19, 2008

(65) Prior Publication Data

US 2010/0159390 A1    Jun. 24, 2010

(51) Int. Cl.
*G03F 7/004* (2006.01)
*G03F 7/30* (2006.01)

(52) U.S. Cl. .................. 430/270.1; 430/302; 430/909; 101/467

(58) Field of Classification Search ............... 430/270.1, 430/302, 909; 101/467
See application file for complete search history.

(56) References Cited

U.S. PATENT DOCUMENTS

| 6,255,033 B1 | 7/2001 | Levanon et al. |
| 6,541,181 B1 | 4/2003 | Levanon et al. |
| 2005/0214677 A1 | 9/2005 | Nagashima |
| 2006/0046199 A1 * | 3/2006 | Mitsumoto et al. ........... 430/302 |
| 2008/0206678 A1 | 8/2008 | Levanon et al. |

FOREIGN PATENT DOCUMENTS

| DE | 21 30 283 A1 | 12/1971 |
| EP | 1 543 046 B1 | 5/2006 |
| WO | WO 01/09682 A2 | 2/2001 |
| WO | 2004/081662 | 9/2004 |

OTHER PUBLICATIONS

U.S. Appl. No. 11/769,766 (D-92228) filed Jun. 28, 2007 titled Radiation-Sensitive Compositions and Elements With Solvent Resistant Poly(Vinyl Acetal)s by M. Levanon et al.
U.S. Appl. No. 11/959,492 (D-94547) filed Dec. 19, 2007 titled Radiation-Sensitive Elements With Developability-Enhancing Compounds by M. Levanon et al.
U.S. Appl. No. 12/195,468 (D-95151) filed Aug. 21, 2008 titled Processing of Positive-Working Lithographic Printing Plate Precursor by M. Levanon et al.
U.S. Appl. No. 12/125,084 (D-94967) filed May 22, 2008 titled Method of Imaging and Developing Positive-Working Imageable Elements by M. Levanon et al.
U.S. Appl. No. 12/025,089 (D-94693) filed Feb. 4, 2008 titled Method of Imaging and Developing Positive-Working Imageable Elements by M. Levanon et al.

* cited by examiner

*Primary Examiner* — John Chu
(74) *Attorney, Agent, or Firm* — J. Lanny Tucker

(57) ABSTRACT

A radiation-sensitive composition can be used to prepare positive-working imageable elements having improved sensitivity and solvent resistance. These elements are useful for making lithographic printing plates and printed circuit boards. The composition includes a water-insoluble polymeric binder that has at least 20 mol % of recurring units comprising hydroxyaryl carboxylic acid ester groups, some of which can be substituted with cyclic imide moieties.

18 Claims, No Drawings

RADIATION-SENSITIVE COMPOSITIONS AND ELEMENTS CONTAINING POLY(VINYL HYDROXYARYL CARBOXYLIC ACID ESTER)S

FIELD OF THE INVENTION

This invention relates to radiation-sensitive compositions and positive-working imageable elements prepared using these compositions. It also relates to methods of imaging these elements to provide imaged elements that can be used as lithographic printing plates or printed circuit boards.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink the ink receptive regions accept the ink and repel the water. The ink is then transferred to the surface of suitable materials upon which the image is to be reproduced. In some instances, the ink can be first transferred to an intermediate blanket that in turn is used to transfer the ink to the surface of the materials upon which the image is to be reproduced.

Imageable elements useful to prepare lithographic (or offset) printing plates typically comprise one or more imageable layers applied over a hydrophilic surface of a substrate (or intermediate layers). The imageable layer(s) can comprise one or more radiation-sensitive components dispersed within a suitable binder. Following imaging, either the exposed regions or the non-exposed regions of the imageable layer(s) are removed by a suitable developer, revealing the underlying hydrophilic surface of the substrate. If the exposed regions are removed, the element is considered as positive-working. Conversely, if the non-exposed regions are removed, the element is considered as negative-working. In each instance, the regions of the imageable layer(s) that remain are ink-receptive, and the regions of the hydrophilic surface revealed by the developing process accept water or aqueous solutions (typically a fountain solution), and repel ink.

Similarly, positive-working compositions can be used to form resist patterns in printed circuit board (PCB) production, thick-and-thin film circuits, resistors, capacitors, and inductors, multichip devices, integrated circuits, and active semiconductive devices.

"Laser direct imaging" methods (LDI) have been known that directly form an offset printing plate or printing circuit board using digital data from a computer, and provide numerous advantages over the previous processes using masking photographic films. There has been considerable development in this field from more efficient lasers, improved imageable compositions and components thereof.

Thermally sensitive imageable elements can be classified as those that undergo chemical transformation(s) in response to, exposure to, or adsorption of, suitable amounts of thermal energy. The nature of thermally induced chemical transformation may be to ablate the imageable composition in the element, or to change its solubility in a particular developer, or to change the tackiness or hydrophilicity or hydrophobicity of the surface layer of the thermally sensitive layer. As such, thermal imaging can be used to expose predetermined regions of an imageable layer that can serve as a lithographic printing surface or resist pattern in PCB production.

Positive-working imageable compositions containing novolak or other phenolic polymeric binders and diazoquinone imaging components have been prevalent in the lithographic printing plate and photoresist industries for many years. Imageable compositions based on various phenolic resins and infrared radiation absorbing compounds are also well known.

A wide range of thermally-sensitive compositions that are useful in thermal recording materials are described in patent GB 1,245,924 (Brinckman), whereby the solubility of any given area of the imageable layer in a given solvent can be increased by the heating of the layer by indirect exposure to a short duration high intensity visible light and/or infrared radiation transmitted or reflected from the background areas of a graphic original located in contact with the recording material.

Thermally imageable, single- or multi-layer elements are also described in WO 97/39894 (Hoare et al.), WO 98/42507 (West et al.), WO 99/11458 (Ngueng et al.), U.S. Pat. No. 5,840,467 (Kitatani), U.S. Pat. No. 6,060,217 (Ngueng et al.), U.S. Pat. No. 6,060,218 (Van Damme et al.), U.S. Pat. No. 6,110,646 (Urano et al.), U.S. Pat. No. 6,117,623 (Kawauchi), U.S. Pat. No. 6,143,464 (Kawauchi), U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), U.S. Pat. No. 6,358,669 (Savariar-Hauck et al.), and U.S. Pat. No. 6,528,228 (Savariar-Hauck et al.), and U.S. Patent Application Publications 2002/0081522 (Miyake et al.) and 2004/0067432 A1 (Kitson et al.).

Positive-working thermally imageable elements containing thermally-sensitive polyvinyl acetals are described in U.S. Pat. Nos. 6,255,033 and 6,541,181 (both Levanon et al.) and WO 04/081662 (Memetea et al.).

Offset printing plates recently have been the subject of increasing performance demands with respect to imaging sensitivity (imaging speed) as well as resistance to common printing room chemicals (chemical resistance). Often, the compositional features used to provide one desired property do not always improve other properties.

SUMMARY OF THE INVENTION

The present invention provides positive-working imageable elements comprising a substrate having thereon an imageable layer comprising a radiation-sensitive composition comprising a water-insoluble, polymeric binder, and a radiation absorbing compound, wherein the polymeric binder comprises recurring units that have pendant substituted or unsubstituted hydroxyaryl carboxylic acid ester groups and that represent at least 20 mol % of the total recurring units.

More specific embodiments of this invention comprise polymeric binders that comprise recurring units represented by one or more of the following Structures (Ia) through (Ic):

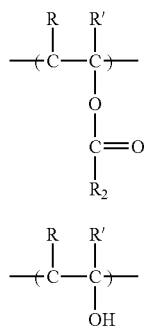

wherein the recurring units of Structure (Ia) are present at from 0 to about 22 mol %, the recurring units of Structure (Ib) are present at from about 20 to about 85 mol %, the recurring units of Structure (Ic) are present at from about 5 to about 40 mol %, based on total recurring units, R and R' are independently hydrogen or substituted or unsubstituted alkyl groups, substituted or unsubstituted cycloalkyl groups, or halo groups, $R_1$ is a substituted or unsubstituted alkyl group, a substituted or unsubstituted cycloalkyl group, or a substituted or unsubstituted aryl group other than a hydroxyaryl group, $R_2$ is a hydroxyaryl group that is optionally substituted.

In some embodiments, $R_2$ is an unsubstituted hydroxyaryl group but in other embodiments, $R_2$ is a hydroxyaryl group that is substituted with a cyclic imide group.

In any of these embodiments, the polymeric binders may further comprise recurring units represented by Structure (Ib') in an amount of from 0 to about 60 mol %:

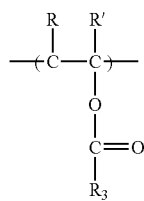

wherein $R_3$ is a hydroxyaryl group that is substituted with a cyclic imide group, and the recurring units represented by Structures (Ib) and (Ib') are present in an amount of at least 20 mol %.

Further, a method of making a printing plate comprises:

A) imagewise exposing a positive-working imageable element of the present invention to provide exposed and non-exposed regions, and B) developing the imagewise exposed element to remove predominantly only the exposed regions.

We have discovered that a need remains for positive-working, single-layer, thermally imageable elements that have improved sensitivity (photospeed). It is also desired that they would have a resistance to printing press chemicals such as lithographic inks, fountain solutions, and the solvents used in washes that is at least as good as the positive-working printing plates already used in the industry.

The positive-working radiation-sensitive imageable elements of this invention solve the noted problem by exhibiting improved imaging sensitivity. In addition, their resistance to press chemicals is at least as good as that of printing plates used in the industry and in some embodiments, it is further improved. In addition, we found that the imageable elements provide images with improved printability and high resolution. These advantages have been achieved by using the noted unique class of water-insoluble poly(vinyl hydroxyaryl carboxylic acid ester)s as polymeric binders in the imageable layer. Some of the polymeric binders having cyclic imide groups on the pendant hydroxyaryl carboxylic acid ester groups provide the imageable elements unexpectedly improved chemical resistance.

DETAILED DESCRIPTION OF THE INVENTION

Definitions

Unless the context otherwise indicates, when used herein, the terms "poly(vinyl hydroxyaryl carboxylic acid ester)", "imageable element", "positive-working imageable element", and "lithographic printing plate precursor" are meant to be references to embodiments of the present invention.

The term "poly(vinyl hydroxyaryl carboxylic acid ester)" is meant to refer to polymers that have at least some recurring units derived from one or more vinyl hydroxyaryl carboxylic acid esters. It includes homopolymers containing only such recurring units, as well as copolymers having recurring units derived from one or more other polymerizable monomers or equivalent sources.

In addition, unless the context indicates otherwise, the various components described herein such as "poly(vinyl hydroxyaryl carboxylic acid ester)", "radiation absorbing compound", "secondary polymeric binder", and "developability-enhancing compound", also refer to mixtures of each component. Thus, the use of the articles "a", "an", and "the" is not necessarily meant to refer to only a single component.

Unless otherwise indicated, percentages refer to percents by weight. Percent by weight can be based on the total solids in a formulation or composition, or on the total dry coating weight of a layer.

The term "single-layer imageable element" refers to imageable elements that require only one layer for imaging, but as pointed out in more detail below, such elements may also include one or more layers under or over (such as a topcoat) the imageable layer to provide various properties.

As used herein, the term "radiation absorbing compound" refers to compounds that are sensitive to certain wavelengths of radiation and can convert photons into heat within the layer in which they are disposed. These compounds may also be known as "photothermal conversion materials", "sensitizers", or "light to heat convertors".

For clarification of definition of any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any different definitions set forth herein should be regarded as controlling.

The terms "polymer" and "poly(vinyl hydroxyaryl carboxylic acid ester)" refer to high and low molecular weight polymers including oligomers and includes both homopolymers and copolymers.

The term "copolymer" refers to polymers that are derived from two or more different monomers, or have two or more different recurring units, even if derived from the same monomer.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction of some other means.

Uses

The radiation-sensitive compositions described herein can be used to form resist patterns in printed circuit board (PCB) production, thick-and-thin film circuits, resistors, capacitors, and inductors, multi-chip devices, integrated circuits, and active semi-conductive devices. In addition, they can be used to provide positive-working imageable elements that in turn can be used to provide lithographic printing plates. Other uses of the compositions would be readily apparent to one skilled in the art. Thus, the polymers described herein could be used in coatings, paints, and other formulations that require a binder for any particular reason.

In some embodiments, the imageable element of this invention is a printed circuit board that comprises, under the imageable layer, an electrically conductive material (such as copper or aluminum) over a non-conductive sub-layer (for example, composed of glass epoxy composites or polyimides.

Radiation-Sensitive Compositions

The radiation-sensitive compositions and imageable elements include one or more water-insoluble, and optionally alkaline solution-soluble, polymeric binders that are poly (vinyl hydroxyaryl carboxylic acid ester)s as defined below. These polymers are considered the "primary" polymeric binders present in the radiation-sensitive composition or imageable layer. The weight average molecular weight ($M_w$) of the useful polymeric binders is generally at least 5,000 and can be up to 500,000 and typically from about 10,000 to about 100,000. The optimal $M_w$ may vary with the specific polymer and its use.

The polymeric binders comprise recurring units that have pendant substituted or unsubstituted hydroxyaryl carboxylic acid ester groups, which recurring units represent at least 20 mol % of the total recurring units.

In some embodiments, the primary polymeric binder comprises recurring units represented by the following Structures (Ia) through (Ic), in any random sequence:

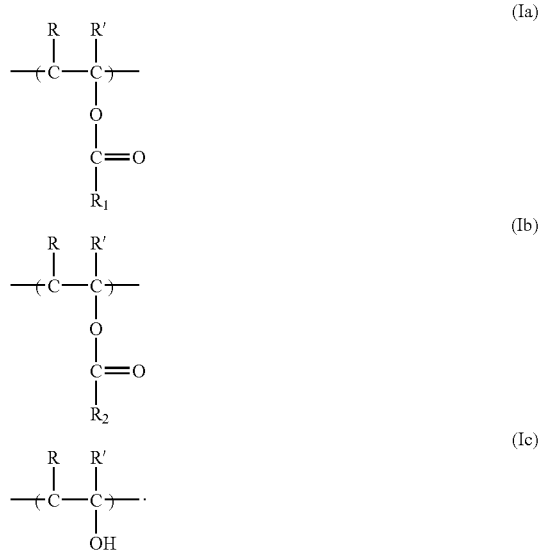

The polymeric binders may comprise recurring units represented by Structure (Ib') in addition or alternatively to the recurring units of Structure (Ib):

wherein the recurring units of Structure (Ia) are present at from 0 to about 22 mol %, the recurring units of Structure (Ib) are present at from about 20 to about 85 mol %, the recurring units of Structure (Ic) are present at from about 5 to about 40 mol %, and the recurring units represented by Structure (Ib') can be present in an amount of from 0 to about 60 mol %, based on total recurring units. For example, the total recurring units of Structure (Ib) and (Ib') can be at least 20 mol %.

In some embodiments, the recurring units represented by Structure (Ia) are present at from about 2 to about 12 mol %, the recurring units represented by Structure (Ib) are present at from about 30 to about 60 mol %, the recurring units represented by Structure (Ib') are present at from about 20 to about 40 mol %, and the recurring units represented by Structure (Ic) are present at from about 10 to about 35 mol %, based on total recurring units, and the sum of the recurring units represented by Structures (Ib) and (Ib') are present at from about 60 to about 90 mol %.

In Structures (Ia), (Ib), (Ib'), and (Ic), R and R' are independently hydrogen, or a substituted or unsubstituted linear or branched alkyl group having 1 to 6 carbon atoms (such as methyl, ethyl, n-propyl, n-butyl, n-pentyl, n-hexyl, chloromethyl, trichloromethyl, iso-propyl, iso-butyl, t-butyl, iso-pentyl, neo-pentyl, 1-methylbutyl and iso-hexyl groups), or substituted or unsubstituted cycloalkyl group having 3 to 6 carbon atoms in the ring (such as cyclopropyl, cyclobutyl, cyclopentyl, methylcyclohexyl, and cyclohexyl groups), or a halo group (such as fluoro, chloro, bromo, or iodo). Typically, R and R' are independently hydrogen, or a substituted or unsubstituted methyl or chloro group, or for example, they are independently hydrogen or unsubstituted methyl.

In Structure (Ia), $R_1$ is a substituted or unsubstituted alkyl group having 1 to 12 carbon atoms (such as methyl, ethyl, isopropyl, t-butyl, and dodecyl), a substituted or unsubstituted cyclolalkyl group having 5 to 10 carbon atoms in the cyclic ring (such as cyclopentyl, cyclohexyl, and 4-methylcyclohexyl), or a substituted or unsubstituted aryl group other than a hydroxyaryl group.

In Structure (Ib), $R_2$ is a hydroxy-substituted aryl group having 6, 10, or 14 carbon atoms in the aromatic ring that has one or more hydroxy substituents and optionally one or more other substituents as well, such as halo (such as chloro or bromo), nitro, branched or linear alkyl (having 1 to 12 carbon atoms), branched or linear haloalkyl (having 1 to 12 carbon atoms), branched or linear alkoxy (having 1 to 10 carbon atoms), and aryl groups, including but not limited to, alkoxy, aryloxy, thioaryloxy, halomethyl, trihalomethyl, halo, nitro, azo, thiohydroxy, thioalkoxy, nitrile, amino, ethenyl, carboxyalkyl, phenyl, alkyl, alkenyl, alkynyl, cycloalkyl, aryl, heteroaryl, and heteroalicyclic groups. A hydroxyl-substituted phenyl group is particularly useful.

In Structure (Ib'), $R_3$ is a hydroxy-substituted aryl group having 6 or 10 carbon atoms in the aromatic ring that is substituted with a cyclic imide group such as an aliphatic or aromatic imide group, including but not limited to, maleimide, phthalimide, tetrachlorophthalimide, hydroxyphthalimide, carboxypthalimide, and naphthalimide groups.

A primary polymeric binder comprising recurring units that are represented by Structures (Ia), (Ib), (Ib'), and (Ic) may contain recurring units other than those defined by the illustrated recurring units and such additional recurring units would be readily apparent to a skilled worker in the art. Thus, the polymeric binders useful in this invention are not limited specifically to the recurring units defined by Structures (Ia) through (Ic). However, in some embodiments, only the recurring units specifically defined in Structures (Ia), (Ib), (Ib'), and (Id) are present.

There also may be multiple types of recurring units from any of the defined classes of recurring units in Structures (Ia) through (Ic) with different substituents. For example, there may be multiple types of recurring units with different $R_1$ groups, there may be multiple types of recurring units with different $R_2$ groups, or there may be multiple types of recurring units with different $R_3$ groups. In addition, the number and type of recurring units in the polymeric binders are generally in random sequence. Thus, for example, the recurring units represented by Structures (Ia) through (Ic) can be provided in any random sequence.

Content of the primary polymeric binder in the radiation-sensitive composition that forms an imageable layer is generally from about 40 to about 95% of the total dry weight, and typically from about 50 to about 80% of the total dry weight.

The primary polymer binders used in the present invention can be prepared by trans-esterification of alkyl or aryl esters of hydroxy-substituted aromatic acids with polyvinyl alcohol in the presence of basic catalysts such as metal hydroxides, metal alkoxides, and cyclic amines in dimethylsulfoxide (DMSO) or N-methylpyrrolidone (NMP).

Some embodiments of the primary polymeric binders have pendant hydroxyaryl carboxylic acid groups that are substituted with an amine or cyclic imide (such as a phthalimide group) on the aromatic ring. Such polymers can be prepared by trans-esterification of amine or cyclic imide derivatives of alkyl or aryl esters of hydroxyl-substituted aromatic acids with polyvinyl alcohol in the presence of basic catalysts such as metal hydroxides, metal alkoxides or cyclic amines in DMSO or NMP, or by trans-esterification of mixtures of cyclic imide derivatives of alkyl or aryl esters of hydroxyl-substituted aromatic acids alkyl and/or aryl esters of hydroxyl-substituted aromatic acids and with polyvinyl alcohol in the presence of basic catalysts such as metal hydroxides, metal alkoxides or cyclic amines in DMSO or NMP.

In (*Acta Polymerica* 41(1990), Nr. 5, 285-289) K. Henning et al. describe esterification of p-hydroxybenzoic acid and o-hydroxybenzoic acid (salicylic acid) with an ethylene-vinyl alcohol copolymer under acidic catalysts in the presence of p-toluenesulfonic acid or ion-exchange resins. These reactions lead to low conversion of esters –20% in case of p-hydroxybenzoic acid and only 10-12% with salicylic acid.

The ester of p-aminosalicylic acid of polyvinyl alcohol with very low conversion was also synthesized using the chloride of 2-hydroxy-4-aminobenzoic acid—lower than 10 mol % of ester units in the resulting polymer (S. N. Ushakov et al., *Dokl. Akad. Nauk SSSR,* 141, 1117-1119, 1961). Similar levels of esterification were observed when the methyl ester of 2-hydroxy-4-aminosalicylic acid was transesterified with polyvinyl alcohol under basic catalysts ($NaOCH_3$) (I. S. Varga, S. Wolkover, *Acta Chim. Acad. Sci. Hung.,* 41, 431 1964).

Synthesis of poly(vinyl alcohol-co-vinyl gallate) is described by G. Jialanella and I. Piirma, *Polymer Bulletin* 18, 385-389 (1987), where 3,4,5-trihydroxybenzoate in DMSO in presence of potassium t-butoxide was transesterified. The synthesized polymers were water soluble that suggests that the conversion was low.

For the synthesis of the polymers useful in this invention, we used the basic catalysis for the transesterification of the methyl or phenyl esters of the hydroxybenzoic acids with polyvinyl alcohol (PVA) in organic solvents that are able to dissolve the PVA-NMP or DMSO. The catalysts used were sodium methoxide, potassium t-butoxide, dry KOH, and cyclic amines like DBU (1,8-diazabicyclo[5,4,0]undec-7-ene (98%). It is important to dry the PVA before the reaction of transesterification. We were surprised to learn that the conversion of the PVA to a copolymer of poly(vinyl alcohol-co-hydroxy-substituted acid aromatic carboxylic acid ester) is very high in the case of the o-hydroxybenzoic (salicylic acid) where it reaches 85-90% compared to low 10-20% conversion for the esters of 3, or 4-hydroxysubstituted benzoic acids, 3,4-dihydroxybenzoic acid, and gallic acid. When an ester of an o-hydroxybenzoic acid containing an electron withdrawing group like nitro group in the methyl ester of the nitrosalicylic acid is used in the transesterification reaction with PVA, the conversion is also low.

The primary polymeric binders described herein can be used alone or in admixture with other alkali soluble polymeric binders, identified herein as "secondary polymeric binders". These additional polymeric binders include poly(vinyl acetal)s, for example, the poly(vinyl acetal)s described in U.S. Pat. Nos. 6,255,033 and 6,541,181 (noted above), WO 04/081662 (also noted above), and in U.S. Patent Application Publication 2008/0206678 (Levanon et al.), which publications are incorporated herein by reference.

The type of the secondary polymeric binder that can be used together with the primary polymeric binder is not particularly restricted. In general, from a viewpoint of not diminishing the positive radiation-sensitivity of the imageable element, the secondary polymeric binder is generally an alkali-soluble polymer also.

Other useful secondary polymeric binders include phenolic resins, including novolak resins such as condensation polymers of phenol and formaldehyde, condensation polymers of m-cresol and formaldehyde, condensation polymers of p-cresol and formaldehyde, condensation polymers of m-/p-mixed cresol and formaldehyde, condensation polymers of phenol, cresol (m-, p-, or m-/p-mixture) and formaldehyde, and condensation copolymers of pyrogallol and acetone. Further, copolymers obtained by copolymerizing compound comprising phenol groups in the side chains can be used. Mixtures of such polymeric binders can also be used.

Novolak resins having a weight average molecular weight of at least 1,500 and a number average molecular weight of at least 300 are useful. Generally, the weight average molecular weight is in the range of from about 3,000 to about 300,000, the number average molecular weight is from about 500 to about 250,000, and the degree of dispersion (weight average molecular weight/number average molecular weight) is in the range of from about 1.1 to about 10.

Certain mixtures of the primary polymeric binders described above can be used, including mixtures of one or more polymers defined above and one or more phenolic resins. For example, mixtures of one or more polymers defined by at least one of Structures (Ia) through (Id) and one or more novolak or resol (or resole) resins (or both novolak and resol resins) can be used.

Examples of other secondary polymeric binders include the following classes of polymers having an acidic group in (1) through (5) shown below on a main chain and/or side chain (pendant group).

(1) sulfone amide (—SO$_2$NH—R),
(2) substituted sulfonamido based acid group (hereinafter, referred to as active imido group) [such as —SO$_2$NHCOR, SO$_2$NHSO$_2$R, —CONHSO$_2$R],
(3) carboxylic acid group (–CO$_2$H),
(4) sulfonic acid group (—SO$_3$H), and
(5) phosphoric acid group (—OPO$_3$H$_2$).

R in the above-mentioned groups (1)-(5) represents hydrogen or a hydrocarbon group.

Representative secondary polymeric binders having the group (1) sulfone amide group are for instance, polymers that are constituted of a minimum constituent unit as a main component derived from a compound having a sulfone amide group. Thus, examples of such a compound include a compound having, in a molecule thereof, at least one sulfone amide group in which at least one hydrogen atom is bound to a nitrogen atom and at least one polymerizable unsaturated group. Among these compounds are m-aminosulfonylphenyl methacrylate, N-(p-aminosulfonylphenyl)methacrylamide, and N-(p-aminosulfonylphenyl)acrylamide. Thus, a homopolymer or a copolymer of polymerizing monomers having a sulfonamide group such as m-aminosulfonylphenyl methacrylate, N-(p-aminosulfonylphenyl) methacrylamide, or N-(p-aminosulfonylphenyl) acrylamide can be used.

Examples of secondary polymeric binders with group (2) activated imido group are polymers comprising recurring units derived from compounds having activated imido group as the main constituent component. Examples of such compounds include polymerizable unsaturated compounds having a moiety defined by the following structural formula.

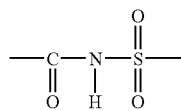

N-(p-toluenesulfonyl) methacrylamide and N-(p-toluenesulfonyl) acrylamide are examples of such polymerizable compounds.

Secondary polymeric binders having any of the groups (3) through (5) include those readily prepared by reacting ethylenically unsaturated polymerizable monomers having the desired acidic groups, or groups that can be converted to such acidic groups after polymerization.

Regarding the minimum constituent units having an acidic group that is selected from the (1) through (5), there is no need to use only one kind of acidic group in the polymer, and in some embodiments, it may be useful to have at least two kinds of acidic groups. Obviously, not every recurring unit in the secondary polymeric binder must have one of the acidic groups, but usually at least 10 mol % and typically at least 20 mol % comprise the recurring units having one of the noted acidic groups.

The secondary polymeric binder can have a weight average molecular weight of at least 2,000 and a number average molecular weight of at least 500. Typically, the weight average molecular weight is from about 5,000 to about 300,000, the number average molecular weight is from about 800 to about 250,000, and the degree of dispersion (weight average molecular weight/number average molecular weight) is from about 1.1 to about 10.

Mixtures of the secondary polymeric binders may be used with the one or more primary polymeric binders. The secondary polymeric binder(s) can be present in an amount of at least 1 weight % and up to 50 weight %, and typically from about 5 to about 30 weight %, based on the dry weight of the total polymeric binders in the radiation-sensitive composition or imageable layer.

The radiation-sensitive composition also includes a developability-enhancing composition. WO 2004/081662 (Memetea et al.) describes the use of various developability-enhancing compounds of acidic nature with phenolic polymers or poly(vinyl acetals) to enhance the sensitivity of positive-working compositions and elements so that required imaging energy is reduced.

Acidic Developability-Enhancing Compounds (ADEC), such as carboxylic acids or cyclic acid anhydrides, sulfonic acids, sulfinic acids, alkylsulfuric acids, phosphonic acids, phosphinic acids, phosphonic acid esters, phenols, sulfonamides, or sulfonimides may permit further improved developing latitude and printing durability. Representative examples of such compounds are provided in [0030] to [0036] of U.S. Patent Application Publication 2005/02146677 (noted above) that is incorporated herein by reference with respect to these acid developability-enhancing compounds. Such compounds may be present in an amount of from about 0.1 to about 30 weight % based on the total dry weight of the radiation-sensitive composition or imageable layer.

The radiation-sensitive composition can also include a developability-enhancing composition containing one or more developability-enhancing compounds (DEC) as described in copending and commonly assigned U.S. Ser. No. 11/959,492 (filed Dec. 19, 2007 by Levanon and Nakash). Representative developability-enhancing compounds can be defined by the following Structure (DEC):

In Structure DEC, $R_4$ and $R_5$ can be the same or different hydrogen or substituted or unsubstituted, linear or branched alkyl groups having 1 to 6 carbon atoms (such as methyl, ethyl, n-propyl, n-butyl, n-pentyl, n-hexyl, chloromethyl, trichloromethyl, iso-propyl, iso-butyl, t-butyl, iso-pentyl, neo-pentyl, 1-methylbutyl, and iso-hexyl groups), substituted or unsubstituted cycloalkyl groups having 5 to 10 carbon atoms in the hydrocarbon ring, or substituted or unsubstituted aryl groups having 6, 10, or 14 carbon atoms in the aromatic ring. In some embodiments, $R_4$ and $R_5$ can be the same or different substituted or unsubstituted aryl groups (such as phenyl or naphthyl groups), and it is particularly useful that at least one of $R_4$ and $R_5$ is a substituted or unsubstituted aryl group when A includes an alkylene group directly connected to —[N($R_4$)($R_5$)]$_n$.

In other embodiments, $R_4$ and $R_5$ can be the same or different hydrogen or substituted or unsubstituted, linear or branched alkyl groups having 1 to 6 carbon atoms (as noted above), substituted or unsubstituted cyclohexyl groups, or substituted or unsubstituted phenyl or naphthyl groups.

In Structure (DEC), A is a substituted or unsubstituted organic linking group having at least one carbon, nitrogen, sulfur, or oxygen atom in the chain, wherein A also comprises a substituted or unsubstituted arylene group (such as a substituted or unsubstituted phenylene group) directly connected to —[N($R_4$)($R_5$)]$_n$. Thus, A can include one or more arylene (for example, having 6 or 10 carbon atoms in the aromatic ring), cycloalkylene (for example, having 5 to 10 carbon atoms in the carbocyclic ring), alkylene (for example, having 1 to 12 carbon atoms in the chain, including linear and branched groups), oxy, thio, amido, carbonyl, carbonamido, sulfonamido, ethenylene (—CH═CH—), ethinylene (—C≡C—), seleno groups, or any combination thereof. In some particularly useful embodiments, A consists of a substituted or unsubstituted arylene group (such as a substituted or unsubstituted phenylene group).

In Structure (DEC), m is an integer of 1 to 4 (typically 1 or 2) and n is an integer of 1 to 4 (typically 1 or 2), wherein m and n can be the same or different.

In still other embodiments, the developability-enhancing compound can be defined by the following Structure (DEC$_1$):

[HO—C(=O)]$_m$—B-A-[N(R$_4$)(R$_5$)]$_n$ (DEC$_1$)

wherein R$_4$ and R$_5$ are as defined above, A is an organic linking group having a substituted or unsubstituted phenylene directly attached to —[N(R$_4$)(R$_5$)]$_n$, B is a single bond or an organic linking group having at least one carbon, oxygen, sulfur, or nitrogen atom in the chain, m is an integer of 1 or 2, n is an integer of 1 or 2. The "B" organic linking group can be defined the same as A is defined above except that it is not required that B contain an arylene group, and usually B, if present, is different than A.

The aryl (and arylene), cycloalkyl, and alkyl (and alkylene) groups described herein can have optionally up to 4 substituents including but not limited to, hydroxy, methoxy and other alkoxy groups, aryloxy groups such phenyloxy, thioaryloxy groups, halomethyl, trihalomethyl, halo, nitro, azo, thiohydroxy, thioalkoxy groups such as thiomethyl, cyano, amino, carboxy, ethenyl and other alkenyl groups, carboxyalkyl, aryl groups such as phenyl, alkyl groups, alkynyl, cycloalkyl, heteroaryl, and heteroalicyclic groups.

The imageable elements can include one or more aminobenzoic acids, dimethylaminobenzoic acids, aminosalicyclic acids, indole acetic acids, anilinodiacetic acids, N-phenyl glycine, or any combination thereof as developability-enhancing compounds. For example, such compounds can include but are not limited to, 4-aminobenzoic acid, 4-(N,N'-dimethylamino)benzoic acid, anilino(di)acetic acid, N-phenyl glycine, 3-indoleacetic acid, and 4-aminosalicyclic acid.

The one or more developability enhancing compounds described above are generally present in an amount of from about 1 to about 30 weight %, or typically from about 2 to about 20 weight %.

In many embodiments, the radiation-sensitive composition and imageable element can have the polymeric binder(s) described above that are present at a coverage of from about 40 to about 95 weight %, one or more developability-enhancing compounds present at a coverage of from about 1 to about 30 weight %, and one or more radiation absorbing compounds that are infrared radiation absorbing compounds that are present at a coverage of from about 1 to about 15 weight %.

It is also possible to use one or more of the developability-enhancing compounds of Structure (DEC) or (DEC$_1$) in combination with one or more Acidic Developability-Enhancing Compounds (ADEC), provided in [0030] to [0036] of U.S. Patent Application Publication 2005/0214677 (noted above) that is incorporated herein by reference with respect to these acid developability-enhancing compounds.

In some instances, at least two of these acidic developability-enhancing compounds are used in combination with one or more (such as two) of the developability-enhancing compounds described above by Structure (DEC) or (DEC$_1$).

In the combinations of the two types of developability-enhancing compounds described above, the molar ratio of one or more compounds represented by Structure (DEC) or (DEC$_1$) to one or more (ADEC) developability-enhancing compounds can be from about 0.1:1 to about 10:1 and more typically from about 0.5:1 to about 2:1.

Still again, the developability-enhancing compounds described by Structure (DEC) or (DEC$_1$) can be used in combination with basic developability-enhancing compounds that can be defined by the following Structure (BDEC):

(R$^7$)$_s$—N—[(CR$^8$R$^9$)$_t$—OH]$_v$ (BDEC)

wherein t is 1 to 6, s is 0, 1, or 2, and v is 1 to 3, provided that the sum of s and v is 3. When s is 1, R$^7$ is hydrogen or an alkyl, alkylamine, cycloalkyl, heterocycloalkyl, aryl, arylamine, or heteroaryl group, and when s is 2, the multiple R$^7$ groups can be the same or different alkyl, alkylamine, cycloalkyl, heterocycloalkyl, aryl, arylamine, or heteroaryl groups, or the two R$^7$ groups together with the nitrogen atom, can form a substituted or unsubstituted heterocyclic ring. R$^8$ and R$^9$ are independently hydrogen or an alkyl group.

Examples of such organic BDEC compounds are N-(2-hydroxyethyl)-2-pyrrolidone, 1-(2-hydroxyethyl)piperazine, N-phenyldiethanolamine, triethanolamine, 2-[bis(2-hydroxyethyl)amino]-2-hydroxymethyl-1.3-propanediol, N,N, N',N'-tetrakis(2-hydroxyethyl)-ethylenediamine, N,N,N',N'-tetrakis(2-hydroxypropyl)-ethylenediamine, 3-[(2-hydroxyethyl)phenylamino]propionitrile, and hexahydro-1, 3,5-tris(2-hydroxyethyl)-s-triazine. Mixtures of two or more of these compounds are also useful.

In the combinations of the two types of developability-enhancing compounds described above, the molar ratio of one or more compounds represented by Structure (DEC) or (DEC$_1$) to one or more (BDEC) developability-enhancing compounds can be from about 0.1:1 to about 10:1 and more typically from about 0.5:1 to about 2:1.

Still again, the compounds described above by Structure (DEC) or (DEC$_1$) can be used in combination with one or more of the compounds identified above as ADEC compound, and with one or more of the compounds identified above by Structure (BDEC) in any suitable molar ratio.

The radiation-sensitive composition can include other optional addenda as described below for the imageable layer.

Imageable Elements

The imageable elements are positive-working imageable elements and the primary polymeric binders described herein are generally present as polymeric binders in a single imageable layer. As noted above, they can be the sole polymeric binders or used in mixture with one or more secondary polymeric binders.

In general, the imageable elements are formed by suitable application of a formulation of the radiation-sensitive composition that contains one or more primary polymeric binders, a radiation absorbing compound (described below), optionally a developability-enhancing composition, and other optional addenda, to a suitable substrate to form an imageable layer. This substrate is usually treated or coated in various ways as described below prior to application of the formulation. For example, the substrate can be treated to provide an "interlayer" for improved adhesion or hydrophilicity, and the imageable layer is applied over the interlayer.

The substrate generally has a hydrophilic surface, or a surface that is more hydrophilic than the applied imaging formulation on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One substrate is composed of an aluminum support that may be coated or treated using techniques known in the art, including physical graining, electrochemical graining and chemical graining, followed by anodizing. The aluminum sheet is mechanically or electrochemically grained and anodized using phosphoric acid or sulfuric acid and conventional procedures.

An optional interlayer may be formed by treatment of the aluminum support with, for example, a silicate, dextrine, calcium zirconium fluoride, hexafluorosilicic acid, phosphate/sodium fluoride, poly(vinyl phosphonic acid) (PVPA), vinyl phosphonic acid copolymer, poly(acrylic acid), or acrylic acid copolymer solution, or an alkali salt of a condensed aryl sulfonic acid as described in GB 2,098,627 and Japanese Kokai 57-195697A (both Herting et al.). The grained and anodized aluminum support can be treated with poly(acrylic acid) using known procedures to improve surface hydrophilicity.

The thickness of the substrate can be varied but should be sufficient to sustain the wear from printing and thin enough to wrap around a printing form. Some embodiments include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press. The use of such imaged cylinders is described for example in U.S. Pat. No. 5,713,287 (Gelbart).

The imageable layer (and radiation-sensitive composition) typically also comprises one or more radiation absorbing compounds. While these compounds can be sensitive to any suitable energy form (for example, UV, visible, and IR radiation) from about 150 to about 1500 nm, they are typically sensitive to infrared radiation and thus, the radiation absorbing compounds are known as infrared radiation absorbing compounds ("IR absorbing compounds") that generally absorb radiation from about 700 to about 1400 nm and typically from about 750 to about 1200 nm. The imageable layer is generally the outermost layer in the imageable element.

Examples of suitable IR dyes include but are not limited to, azo dyes, squarylium dyes, croconate dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squarine dyes, oxazole dyes, croconine dyes, porphyrin dyes, and any substituted or ionic form of the preceding dye classes. Suitable dyes are described for example, in U.S. Pat. No. 4,973,572 (DeBoer), U.S. Pat. No. 5,208,135 (Patel et al.), U.S. Pat. No. 5,244,771 (Jandrue Sr. et al.), and U.S. Pat. No. 5,401,618 (Chapman et al.), and EP 0 823 327A1 (Nagasaka et al.).

Cyanine dyes having an anionic chromophore are also useful. For example, the cyanine dye may have a chromophore having two heterocyclic groups. In another embodiment, the cyanine dye may have from about two sulfonic acid groups, such as two sulfonic acid groups and two indolenine groups. Useful IR-sensitive cyanine dyes of this type are described for example in U.S Patent Application Publication 2005-0130059 (Tao).

A general description of a useful class of suitable cyanine dyes is shown by the formula in [0026] of WO 2004/101280 (Munnelly et al.).

In addition to low molecular weight IR-absorbing dyes, IR dye moieties bonded to polymers can be used. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), and U.S. Pat. No. 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above).

Useful IR absorbing compounds can also be pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer and preferably the pigment particle size will be less than half the thickness of the imageable layer.

In the imageable elements, the radiation absorbing compound is generally present at a dry coverage of from about 0.1 to about 30 weight %, or it is an IR dye that is present in an amount of from about 0.5 to about 25 weight %. The particular amount needed for this purpose would be readily apparent to one skilled in the art, depending upon the specific compound used.

Alternatively, the radiation absorbing compounds may be included in a separate layer that is in thermal contact with the imageable layer. Thus, during imaging, the action of the radiation absorbing compound in the separate layer can be transferred to the imageable layer without the compound originally being incorporated into it.

The imageable layer (and radiation-sensitive composition) can also include one or more additional compounds that are colorant dyes, or UV or visible light-sensitive components. Colorant dyes that are soluble in an alkaline developer are useful. Useful polar groups for colorant dyes include but are not limited to, ether groups, amine groups, azo groups, nitro groups, ferrocenium groups, sulfoxide groups, sulfone groups, diazo groups, diazonium groups, keto groups, sulfonic acid ester groups, phosphate ester groups, triarylmethane groups, onium groups (such as sulfonium, iodonium, and phosphonium groups), groups in which a nitrogen atom is incorporated into a heterocyclic ring, and groups that contain a positively charged atom (such as quaternized ammonium group). Compounds that contain a positively-charged nitrogen atom useful as colorant dyes include, for example, tetraalkyl ammonium compounds and quaternized heterocyclic compounds such as quinolinium compounds, benzothiazolium compounds, pyridinium compounds, and imidazolium compounds. Further details and representative compounds useful as dissolution inhibitors are described for example in U.S. Pat. No. 6,294,311 (noted above). Useful colorant dyes include triarylmethane dyes such as ethyl violet, crystal violet, malachite green, brilliant green, Victoria blue B, Victoria blue R, and Victoria pure blue BO, BASONYL® Violet 610 and D11 (PCAS, Longjumeau, France). These compounds can act as contrast dyes that distinguish the non-exposed (non-imaged) regions from the exposed (imaged) regions in the developed imageable element.

When a colorant dye is present in the imageable layer, its amount can vary widely, but generally it is present in an amount of from about 0.5 weight % to about 30 weight %.

The imageable layer (and radiation-sensitive composition) can further include a variety of additives including dispersing agents, humectants, biocides, plasticizers, surfactants for coatability or other properties, viscosity builders, fillers and extenders, pH adjusters, drying agents, defoamers, preservatives, antioxidants, development aids, rheology modifiers or combinations thereof, or any other addenda commonly used in the lithographic art, in conventional amounts.

The positive-working imageable element can be prepared by applying the imageable layer (radiation-sensitive composition) formulation over the surface of the substrate (and any other hydrophilic layers provided thereon) using conventional coating or lamination methods. Thus, the formulation can be applied by dispersing or dissolving the desired ingredients in a suitable coating solvent, and the resulting formulation is applied to the substrate using suitable equipment and procedures, such as spin coating, knife coating, gravure coating, die coating, slot coating, bar coating, wire rod coating, roller coating, or extrusion hopper coating. The formulation can also be applied by spraying onto a suitable support (such as an on-press printing cylinder).

The coating weight for the imageable layer is from about 0.5 to about 3.5 g/m$^2$ and typically from about 1 to about 3 g/m$^2$.

The selection of solvents used to coat the layer formulation(s) depends upon the nature of the polymeric binders and other polymeric materials and non-polymeric components in the formulations. Generally, the imageable layer formulation is coated out of acetone, methyl ethyl ketone, or another ketone, tetrahydrofuran, 1-methoxy-2-propanol, N-methyl pyrrolidone, 1-methoxy-2-propyl acetate, γ-butyrolactone, and mixtures thereof using conditions and techniques well known in the art.

Alternatively, the layer(s) may be applied by conventional extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

Representative methods for preparing positive-working imageable elements are described below in the examples.

After the imageable layer formulation is dried on the substrate (that is, the coating is self-supporting and dry to the touch), the element can be heat treated at from about 40 to about 90° C. (typically at from about 50 to about 70° C.) for at least 4 hours and preferably at least 20 hours, or for at least 24 hours. The maximum heat treatment time can be several days, but the optimal time and temperature for the heat treatment can be readily determined by routine experimentation. This heat treatment can also be known as a "conditioning" step. Such treatments are described for example, in EP 823, 327 (Nagaska et al.) and EP 1,024,958 (McCullough et al.).

It may also be desirable that during the heat treatment, the imageable element is wrapped or encased in a water-impermeable sheet material to represent an effective barrier to moisture removal from the precursor. This sheet material is sufficiently flexible to conform closely to the shape of the imageable element (or stack thereof) and is generally in close contact with the imageable element (or stack thereof). For example, the water-impermeable sheet material is sealed around the edges of the imageable element or stack thereof. Such water-impermeable sheet materials include polymeric films or metal foils that are sealed around the edges of imageable element or stack thereof.

Alternatively, the heat treatment (or conditioning) of the imageable element (or stack thereof) is carried out in an environment in which relative humidity is controlled to from about 25%, or from about 30%. Relative humidity is defined as the amount of water vapor present in air expressed as a percentage of the amount of water required for saturation at a given temperature.

Usually, at least 5 and up to 100 imageable elements are heat treated at the same time. More commonly, such a stack includes at least 500 imageable elements. Alternatively, the imageable element(s) may be heat treated in the form of a coil and then cut into individual elements at a later time. Such coils can include at least 1000 m$^2$ of imageable surface and more typically at least 3000 m$^2$ of imageable surface. Adjacent coils or "spirals" or a coil, or strata of a stack may, if desired, be separated by interleaving materials, for example, papers or tissues that may be sized with plastics or resins (such as polythene).

Imaging and Development

The imageable elements of this invention can have any useful form including, but not limited to, printing plate precursors, printing cylinders, printing sleeves and printing tapes (including flexible printing webs). For example, the imageable members are lithographic printing plate precursors for forming lithographic printing plates.

Printing plate precursors can be of any useful size and shape (for example, square or rectangular) having the requisite imageable layer disposed on a suitable substrate. Printing cylinders and sleeves are known as rotary printing members having the substrate and imageable layer in a cylindrical form. Hollow or solid metal cores can be used as substrates for printing sleeves.

During use, the imageable elements are exposed to a suitable source of radiation such as UV, visible light, or infrared radiation, depending upon the radiation absorbing compound present in the radiation-sensitive composition, at a wavelength of from about 150 to about 1500 nm. For most embodiments, imaging is carried out using an infrared laser at a wavelength of from about 700 to about 1400 nm. The laser used to expose the imaging member is can be a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at one or more wavelengths with the range of from about 750 to about 1200 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. A useful imaging apparatus is available as models of Kodak Trendsetter® imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

IR Imaging speeds may be from about 30 to about 1500 mJ/cm$^2$ or from about 40 to about 300 mJ/cm$^2$.

While laser imaging is usually practiced, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, as Fujitsu Thermal Head FTP-040 MCS001 and TDK Thermal Head F415 HH7-1089).

Imaging is generally carried out using direct digital imaging. The image signals are stored as a bitmap data file on a computer. Such data files may be generated by a raster image processor (RIP) or other suitable means. The bitmaps are constructed to define the hue of the color as well as screen frequencies and angles.

Imaging of the imageable element produces an imaged element that comprises a latent image of imaged (exposed) and non-imaged (non-exposed) regions. Developing the imaged element with a suitable developer removes predominantly only the exposed regions of the imageable layer and any layers underneath it, and exposing the hydrophilic surface of the substrate. Thus, such imageable elements are "positive-working" (for example, "positive-working" lithographic printing plate precursors).

Thus, development is carried out for a time sufficient to remove the imaged (exposed) regions of the imageable layer, but not long enough to remove the non-imaged (non-exposed) regions of the imageable layer. The imaged (exposed) regions of the imageable layer are described as being "soluble" or "removable" in the developer because they are removed, dissolved, or dispersed within the developer more readily than the non-imaged (non-exposed) regions of the imageable layer. Thus, the term "soluble" also means "dispersible".

The imaged elements are generally developed using conventional processing conditions. Both aqueous alkaline developers and organic solvent-containing developers can be used. In most embodiments of the method of this invention, the higher pH aqueous alkaline developers that are commonly used to process positive-working imaged elements are used.

Such aqueous alkaline developers generally have a pH of at least 9 and typically of at least 11. Useful alkaline aqueous developers include 3000 Developer, 9000 Developer, GoldStar Developer, GoldStar Plus Developer, GoldStar Premium Developer, GREENSTAR Developer, ThermalPro Developer, PROTHERM Developer, MX1813 Developer, and MX1710 Developer (all available from Eastman Kodak Company), as well as Fuji HDP7 Developer (Fuji Photo) and Energy CTP Developer (Agfa). These compositions also generally include surfactants, chelating agents (such as salts of ethylenediaminetetraacetic acid), and various alkaline agents (such as inorganic metasilicates, organic metasilicates, hydroxides, and bicarbonates).

It may also be possible to use developers that are commonly used to process negative-working imaged elements. Such developers are generally single-phase solutions containing one or more organic solvents that are miscible with water. Useful organic solvents the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as methoxyethanol and 2-butoxyethanol. The organic solvent(s) is generally present in an amount of from about 0.5 to about 15% based on total developer weight. Such developers can be neutral, alkaline, or slightly acidic in pH. Most of these developers are alkaline in pH, for example up to 11.

Representative organic solvent-containing developers include ND-1 Developer, 955 Developer, "2 in 1" Developer, 956 Developer, and 980 Developer (available from Eastman Kodak Company), HDN-1 Developer (available from Fuji), and EN 232 Developer (available from Agfa).

Generally, the developer is applied to the imaged element by rubbing or wiping it with an applicator containing the developer. Alternatively, the imaged element can be brushed with the developer or the developer may be applied by spraying the element with sufficient force to remove the exposed regions. Still again, the imaged element can be immersed in the developer. In all instances, a developed image is produced in a lithographic printing plate having excellent resistance to press room chemicals. Development can be carried out in suitable apparatus containing suitable rollers, brushes, tanks, and plumbing for delivery, disposal, or recirculation of solutions if desired.

Following development, the imaged element can be rinsed with water and dried in a suitable fashion. The dried element can also be treated with a conventional gumming solution (preferably gum arabic).

The imaged and developed element can also be baked in a post-exposure bake operation that can be carried out to increase run length of the resulting imaged element. Baking can be carried out, for example at from about 220° C. to about 260° C. for from about 1 to about 10 minutes, or at about 120° C. for about 30 minutes.

Printing can be carried out by applying a lithographic ink and fountain solution to the printing surface of the imaged element. The ink is taken up by the non-imaged (non-exposed or non-removed) regions of the imageable layer and the fountain solution is taken up by the hydrophilic surface of the substrate revealed by the imaging and development process. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The following examples are presented as a means to illustrate the practice of this invention but the invention is not intended to be limited thereby.

EXAMPLES

The following components were used in the preparation and use of the examples. Unless otherwise indicated, the components are available from Aldrich Chemical Company (Milwaukee, Wis.):

BF-03 represents a poly(vinyl alcohol), 98% hydrolyzed (Mw=15,000) that was obtained from Chang Chun Petrochemical Co. Ltd. (Taiwan).

Crystal Violet (C.I. 42555) is Basic Violet 3 ($\lambda_{max}$=588 nm).

DBU represents 1,8-diazabicyclo[5,4,0]undec-7-ene (98%).

DMABA represents 4-(dimethylamino)benzoic acid.

DMFA represents N,N-dimethylformamide.

DNSEPC represents 2-diazo-1-naphthol-4-sulfonic acid ester of a p-cresol resin that was obtained from Sanbo Chemical Industries Co. Ltd. (Japan).

DMSO represents dimethylsulfoxide.

KOH was used as potassium hydroxide pellets (85%+ACS grade).

LB9900 is a resole resin that was obtained from Hexion Specialty Chemicals (Columbus, Ohio).

MEK represents methyl ethyl ketone.

MMS represents methyl ester of methyl salicyclic acid that was obtained from Acros Organics (Geel, Belgium).

NMP represents N-methyl pyrrolidone.

PM represents 1-methoxy-2-propanol, can be obtained as Arcosolve® PM from LyondellBasell Industries (the Netherlands).

S0094 is an infrared radiation absorbing dye ($\lambda_{max}$=813 nm) that was obtained from FEW Chemicals (France).

Sal.sal.acid represents salicylsalicylic acid that was obtained from Acros Organics (Geel, BE).

Salol represents the phenyl ester of salicyclic acid.

Sudan Black B is a neutral diazo dye (C.U. 26150).

Victoria Blue R is a triarylmethane dye (Basic Blue 11, C.I. 44040).

Preparation of N-Phthalimido Salicylic Acid Methyl Ester:

200 Grams of methyl ester of aminosalicylic acid and 183 g of phthalic anhydride were charged to a 2.5 liter round bottom glass vessel equipped with a mechanical stirrer and a Dean-Stark separation column. Then, 1.5 kg of anisole were charged to the reaction vessel. The mixture was heated to the reflux of anisole under stirring. Water is separated from the anisole in the Dean-Stark separator. When the amount of water reached the calculated value, heating was continued for another hour. Then heating was stopped and the reaction mixture is chilled to room temperature. The precipitated product was filtered off, washed on the filter with toluene, and dried. The yield of the product was 85-90%. The product is pure enough to not require crystallization, m.p. 218-219° C.

Preparation of Polymer A:

BF-03 (50 g) was added to reaction vessel fitted with a water-cooled condenser, a dropping funnel, and thermometer, and containing DMSO (450 g). With continual stirring, the mixture was heated for 30 minutes at 80° C. until it became a clear solution. To this solution, anisole (100 g) was added and vacuum (10 mm Hg) was applied. The azeotrope of water: anisole was distilled out together with some of the DMSO. Potassium t-butoxide (12.5 g) and methyl salicylate (150 g) were added. Vacuum (10 mm Hg) was applied to the reaction mixture for 18 hours under stirring and heating, distilling out the released methanol and t-butanol. The reaction mixture was chilled to room temperature and neutralized with 10 g of 37% HCl, then blended with 6 kg of a 1:1 water/methanol mixture. The precipitated polymer was washed with water, filtered and dried in vacuum for 24 hours at 50° C. to provide 148 g of dry Polymer A.

Preparation of Polymer B:

Polymer B was prepared as described for making Polymer A, but instead of potassium t-butoxide, KOH (15.5 g) was added to the reaction mixture. When the KOH was completely dissolved, anisole (100 g) was added to the reaction mixture and the anisole:water azeotrope was distilled out. After distillation, the reaction mixture was stirred and heated at 80° C. under vacuum for additional 12 hours. The reaction mixture was chilled to room temperature and neutralized with 10 g of 37% hydrochloric acid and blended with 6 kg of a 1:1 water/methanol mixture. The precipitated polymer was washed with water, filtered and dried in vacuum for 24 hours at 50° C. to provide 136 g of dry Polymer B.

Preparation of Polymer C:

BF-03 polyvinyl alcohol (8.8 g) was added to a reaction vessel fitted with a water-cooled condenser and thermometer, containing 50 g of DMSO. With continual stirring, the mixture was heated for 0.5 hour at 80° C. until it became a clear solution. Then, 3.05 g of DBU and 13.0 g of methyl salicylate were added to the reaction mixture. Vacuum (10 mm Hg) was applied to the mixture for 12 hours under stirring and heating, distilling out the released methanol. It was then chilled to room temperature and blended with 0.5 kg of a 1:1 water/methanol mixture. The resulting precipitated polymer was washed with water, filtered, and dried in vacuum for 24 hours at 50° C. to provide 24.5 g of dry Polymer C.

Preparation of Polymer D:

BF-03 polyvinyl alcohol (50 g) was added to reaction vessel fitted with a water-cooled condenser and thermometer, containing 450 g of DMSO. With continual stirring, the reaction mixture was heated for 0.5 hour at 80° C. until it became a clear solution. Then, 12.5 g of potassium t-butoxide and 240 g of Salol were added to the reaction mixture. The reaction proceeded for 12 hours under stirring and heating and the reaction mixture was chilled to room temperature reaction mixture, neutralized with 10 g of 37% hydrochloric acid, and blended with 6 kg of 1:1 water/methanol mixture. The resulting precipitated polymer was washed with water, filtered, dissolved in acetone, and re-precipitated into MEOH. The resulting precipitate was filtered and dried in vacuum for 24 hours at 50° C. to provide 128 g of dry Polymer D.

Preparation of Polymer E:

The procedure used to prepare Polymer A was repeated except that instead of methyl salicylate, 185 g of MMS were used to provide 152 grams of Polymer E.

Preparation of Polymer F:

The procedure used to prepare Polymer A was repeated except that instead of methyl salicylate, 186.1 g of 4-aminosalicylic acid methyl ester were used to provide 123 grams of Polymer F.

Preparation of Polymer G:

The procedure used to prepare Polymer A was repeated except that instead of methyl salicylate, 200 g of 4-phthalimidosalicylic acid methyl ester were used to provide 208 grams of Polymer G.

Preparation of Polymer H:

The procedure used to prepare Polymer G was repeated except that 132 g of 4-phthalimidosalicylic acid methyl ester were used in combination with 101 g of methyl salicylate to provide 198.5 grams of Polymer H.

Invention Example 1

An imageable element of the present invention was prepared in the following manner. A radiation-sensitive composition was prepared using the following components:

| | |
|---|---|
| Polymer A | 8.38 g |
| LB9900 (50% in PM) | 8.82 g |
| Victoria Blue R | 0.36 g |
| S 0094 IR Dye | 0.36 g |
| Sudan Black B | 0.14 g |
| DMABA | 0.79 g |
| MEK | 37 g |
| PM | 63 g |

The composition was filtered and applied to an electrochemically roughened and anodized aluminum substrate that had been subjected to a treatment using an aqueous solution of sodium phosphate and sodium fluoride by means of common methods and the resulting imageable layer coating is dried for 1 minute at 100° C. in Glunz&Jensen "Unigraph Quartz" oven. The dry coating weight of the imageable layer was about 1.5 g/m$^2$.

The resulting imageable element was conditioned with interleaving paper for 48 hours at 60° C. and 30% RH. It was then exposed on a Kodak® Lotem 400 Quantum imager in a range of energies 40 mJ/cm$^2$ to 150 mJ/cm$^2$ and developed for 20 seconds at 23° C. in a Glunz&Jensen "InterPlater 85HD" processor using a solution of 7.5% potassium metasilicate. The resulting printing plate was evaluated for sensitivity (Clearing Point: the lowest imaging energy at which the exposed regions were completely removed by the developer at a given temperature and time, and Linearity Point: the energy at which the 50% dots at 200 lpi screen are reproduced as 50%±0.2% dots), cyan density loss in non-imaged (non-exposed) areas, solvent resistance, bake ability, and on-press run length (not baked, 1% dots at 200 lpi not damaged).

The imaged element was baked after exposure in a Wisconsin SPC-HD 34/125 oven at 260° C. at speeds of 0.5 m/min to 1.0 m/min. DMFA was then applied to the printing plate surface for 5 minutes and then wiped with a cloth. The conditions when no coating was removed were considered as full baking. The results are shown in the following TABLE I below.

TABLE I

| Clear Point (mJ/cm$^2$) | Linear Point (mJ/cm$^2$) | Cyan Density Loss (%) | Bakeability (T/Speed) | Run Length (×1000) impressions |
|---|---|---|---|---|
| 45 | 90 | 1.3 | 260° C./1 m/min. | 200 |

The results in TABLE I show that the radiation-sensitive composition containing the primary polymer poly(vinyl salicylate) within the scope of this invention provided easily baked imageable elements with excellent sensitivity when imaged in digital imaging device at 700-1000 nm as well as excellent press performance.

Invention Example 2

Another imageable element of the present invention was prepared in the following manner. A radiation-sensitive composition was prepared using the following components:

| | |
|---|---|
| Polymer B | 1.16 g |
| LB9900 (50% in PM) | 1.03 g |
| Crystal Violet | 0.04 g |
| S 0094 IR Dye | 0.05 g |
| DNSEPC | 0.1 g |
| Sudan Black B | 0.04 g |
| DMABA | 0.12 g |
| MEK | 4.6 g |
| PM | 7.9 g |

The composition was filtered and applied to an electrochemically roughened and anodized aluminum substrate that has been subjected to a treatment using an aqueous solution of sodium phosphate and sodium fluoride by means of common methods and the coating was dried for 1 minute at 100° C. in a Glunz&Jensen "Unigraph Quartz" oven. The dry coating weight of the imageable layer was about 1.5 g/m$^2$.

The resulting imageable element was imaged in an "ACTINA E" fluorescent frame for 20 seconds using a mask bearing a high resolution image. The imaged element was then developed for 20 seconds at 23° C. in a 6% potassium metasilicate solution, providing a sharp image with a cyan density loss (CDL) of 4.8%.

The second imageable element of this example was exposed on a Kodak® Lotem 400 Quantum imager in a range of energies of from 40 mJ/cm$^2$ to 120 mJ/cm$^2$ and developed for 30 seconds at 23° C. in a 6% potassium metasilicate solution. The resulting printing plate was evaluated for sensitivity (Clearing Point—lowest imaging energy at which the imaged regions are completely removed by the developer; Linearity Point—the energy at which the 50% dots at 200 lpi screen are reproduced as 50%±0.2% dots) and Cyan Density Loss in non-imaged areas. The results for this second printing plate are provided below in TABLE II

TABLE II

| Clear Point (mJ/cm$^2$) | Linearity Point (mJ/cm$^2$) | Cyan Density Loss (%) |
|---|---|---|
| 50 | 90 | 10.3 |

The results in TABLE II show that the radiation-sensitive composition containing the primary polymer poly(vinyl salicylate) within the scope of this invention and DNQ derivatives provides imageable elements with excellent sensitivity when imaged in digital imaging device at 700-1000 nm, or when imaged at 300-500 nm.

Invention Example 3

Another imageable element of the present invention was prepared in the following manner. A radiation-sensitive composition was prepared using the following components:

| | |
|---|---|
| Polymer C | 1.7 g |
| LB9900 | 1.4 g |
| Victoria Blue R | 0.07 g |
| Sudan Black B | 0.028 g |
| DNSEPC | 0.14 g |
| DMABA | 0.154 g |
| MEK | 6 g |
| PM | 10.4 g |

This radiation-sensitive composition was filtered and applied to an electrochemically roughened and anodized aluminum substrate that had been subjected to a treatment using an aqueous solution of sodium phosphate and sodium fluoride by means of common methods and the coating is dried for 1 minute at 100° C. in a Glunz&Jensen "Unigraph Quartz" oven. The dry coating weight of the imageable layer was about 1.5 g/m².

The resulting imageable element was imaged in an "ACTINA E" fluorescent frame for 20 seconds using a mask bearing a high-resolution image. The imaged element was developed for 13 seconds at 23° C. in a 7% potassium metasilicate, providing a sharp image with a Cyan Density Loss of 4.0%.

Invention Example 4

Another imageable element of the present invention was prepared in the following manner. A radiation-sensitive composition was prepared using the following components:

| | |
|---|---|
| Polymer G | 10.02 g |
| S 0094 IR Dye | 0.34 g |
| Sudan Black B | 0.14 g |
| Crystal Violet | 0.27 g |
| 2,4-Dihydroxybenzoic acid | 2 g |
| NMP | 70 g |
| PM | 86 g |

The composition was filtered and applied to an electrochemically roughened and anodized aluminum substrate that had been subjected to a treatment using an aqueous solution of sodium phosphate and sodium fluoride by means of common methods and the resulting imageable layer coating is dried for 1 minute at 130° C. in Glunz&Jensen "Unigraph Quartz" oven. The dry coating weight of the imageable layer was about 1.5 g/m².

The resulting imageable element was conditioned with interleaving paper for 48 hours at 60° C. and 30% RH. It was then exposed on a Kodak® Lotem 400 Quantum imager in a range of energies 60 mJ/cm² to 180 mJ/cm² and developed for 30 seconds at 23° C. in a Glunz&Jensen "InterPlater 85HD" processor using a solution of 6.8% potassium silicate based developer. The resulting printing plate was evaluated for sensitivity (Clearing Point: the lowest imaging energy at which the exposed regions were completely removed by the developer at a given temperature and time, and Linearity Point: the energy at which the 50% dots at 200 lpi screen are reproduced as 50%±0.2% dots), cyan density loss in non-imaged (non-exposed) areas, solvent resistance, bake ability, and on-press run length (not baked, 1% dots at 200 lpi not damaged).

The imaged element was baked after exposure in a Wisconsin SPC-HD 34/125 oven at 260° C. at speeds of 0.5 m/min to 1.0 m/min. DMFA was then applied to the printing plate surface for 5 minutes and then wiped with a cloth. The conditions when no coating was removed were considered as full baking. The results are shown in the following TABLE III below.

TABLE III

| Clear Point (mJ/cm²) | Linear Point (mJ/cm²) | Cyan Density Loss (%) | Bakeability (T/Speed) | Run Length (×1000) impressions |
|---|---|---|---|---|
| 90 | 170 | 0.5 | 250° C./0.75 m/min | 150 |

Invention Example 5

Another imageable element of the present invention was prepared in the following manner. A radiation-sensitive composition was prepared using the following components:

| | |
|---|---|
| Polymer H | 1.7 g |
| S 0094 IR Dye | 0.04 g |
| Victoria Blue R | 0.037 g |
| Sudan Black B | 0.014 g |
| Sal.sal. acid | 0.135 g |
| DMABA | 0.134 g |
| NMP | 6 g |
| PM | 10.4 g |

The composition was filtered and applied to an electrochemically roughened and anodized aluminum substrate that had been subjected to a treatment using an aqueous solution of sodium phosphate and sodium fluoride by means of common methods and the resulting imageable layer coating is dried for 1 minute at 130° C. in Glunz&Jensen "Unigraph Quartz" oven. The dry coating weight of the imageable layer was about 1.5 g/m².

The resulting imageable element was conditioned with interleaving paper for 48 hours at 60° C. and 30% RH. It was then exposed on a Kodak® Lotem 400 Quantum imager in a range of energies 60 mJ/cm² to 180 mJ/cm² and developed for 30 seconds at 23° C. in a Glunz&Jensen "InterPlater 85HD" processor using a solution of 6.0% potassium silicate based developer. The resulting printing plate was evaluated for sensitivity (Clearing Point: the lowest imaging energy at which the exposed regions were completely removed by the developer at a given temperature and time, and Linearity Point: the energy at which the 50% dots at 200 lpi screen are reproduced as 50%±0.2% dots), cyan density loss in non-imaged (non-exposed) areas, solvent resistance, bake ability, and on-press run length (not baked, 1% dots at 200 lpi not damaged).

The imaged element was baked after exposure in a Wisconsin SPC-HD 34/125 oven at 260° C. at speeds of 0.5 m/min to 1.0 m/min. DMFA was then applied to the printing plate surface for 5 minutes and then wiped with a cloth. The conditions when no coating was removed were considered as full baking. The results are shown in the following TABLE IV below.

TABLE IV

| Clear Point (mJ/cm²) | Linear Point (mJ/cm²) | Cyan Density Loss (%) | Bakeability (T/Speed) | Run Length (×1000) impressions |
|---|---|---|---|---|
| 60 | 140 | 0.5 | 250° C./0.75 m/min | 200 |

Solvent Resistance Evaluation

Comparative Examples 1 & 2

Two commercial positive-working printing plate precursors were compared to the imageable elements of the present invention. These commercial elements were a Kodak SWORD ULTRA Thermal Printing Plate that is available from Eastman Kodak Company (Norwalk, Conn.), and Fuji Photo's LH-PJE printing plate. The Kodak Sword Ultra Thermal Printing Plate comprises an imageable layer that contains a predominant polymeric binder that is outside the scope of the present invention. Fuji Photo's LH-PJE printing plate has a single imageable layer that is also outside the scope of the present invention.

The elements of Invention Examples 1, 4, and 5 and Comparative Examples 1 and 2 were evaluated in the following tests:

Resistance to UV Wash Test 1: Drops of the Vam UV Wash were placed on the imaged and developed printing plates at 5 minute intervals up to 10 minutes, and then the drops were removed with a cloth. The amount of removed printing layer was estimated.

Resistance to UV Wash Test 2: Drops of a mixture of diacetone alcohol (DAA) and water at a ratio of 4:1 were placed on the imaged and developed printing plates at 5 minute intervals up to 10 minutes, and then the drops were removed with a cloth. The amount of removed printing layer was estimated.

Resistance to Alcohol-Sub Fountain Solution: Drops of a mixture of 2-butoxyethanol (BC) and water at a ratio of 4:1 were placed on the imaged and developed printing plates at 5 minute intervals up to 10 minutes, and then the drops were removed with a cloth. The amount of removed printing layer was estimated.

The results of these tests are shown in the following TABLE V. The results show that the compositions containing the primary binder poly(vinyl hydroxyaryl carboxylic acid esters) containing cyclic imide moieties within the scope of this invention provide imageable elements with excellent solvent resistance to a broad range of press chemicals.

The invention has been described in detail with particular reference to certain preferred embodiments thereof, but it will be understood that variations and modifications can be effected within the spirit and scope of the invention.

The invention claimed is:

1. A positive-working imageable element comprising a substrate having thereon an imageable layer comprising a water-insoluble polymeric binder, and a radiation absorbing compound, wherein said polymeric binder comprises recurring units that have pendant hydroxyaryl carboxylic acid ester groups and that represent at least 20 mol % of the total recurring units.

2. The element of claim 1 wherein said polymeric binder comprises recurring units represented by the following Structures (Ia) through (Ic):

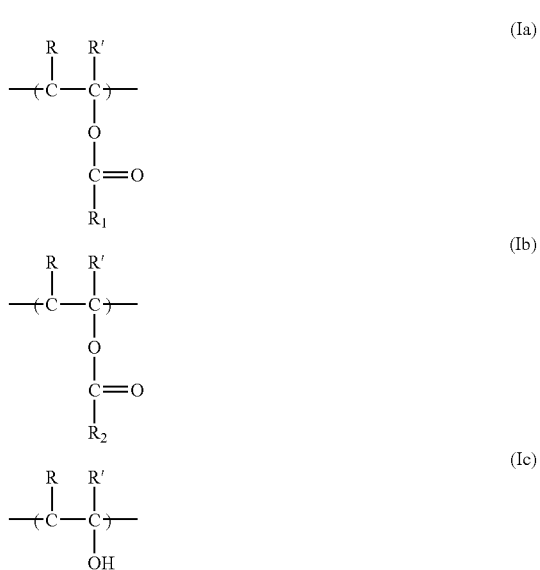

wherein the recurring units of Structure (Ia) are present at from 0 to about 22 mol %, the recurring units of Structure (Ib) are present at from about 20 to about 85 mol %, the recurring units of Structure (Ic) are present at from about 5 to about 40 mol %, based on total recurring units, R and R' are independently hydrogen or substituted or unsubstituted alkyl groups, substituted or unsubstituted cycloalkyl groups, or halo groups, $R_1$ is a substituted or unsubstituted alkyl group, a

TABLE V

| | | SOLVENT RESISTANCE | | | | | |
|---|---|---|---|---|---|---|---|
| | | Resistance to Alcohol-Fountain Solution BC:H$_2$O (4:1) | | Resistance to UV Wash | | | |
| | | | | DAA:H$_2$O (4:1) | | UV Wash (Varn) | |
| EXAMPLE | POLYMER | 5 min | 10 min | 5 min | 10 min | 5 min | 10 min |
| Invention 1 | A | * | * | * | * | * | * |
| Invention 4 | G | 0 | 0 | 0 | 3 | 0 | 2 |
| Invention 5 | H | 3.5 | 5% | 0 | 5% | 3 | 17% |
| Comparative 1 (Kodak SWORD ULTRA) | | 14% | 19% | 15% | 38% | 8% | 12% |
| Comparative 2 (Fuji LH-PJE) | | 0 | 1% | 28% | 70% | 1% | 1.2% |

* Coating dissolved or almost dissolved substituted or unsubstituted cycloalkyl group, or a substituted or unsubstituted aryl group other than a hydroxyaryl group, $R_2$ is a hydroxyaryl group that is optionally substituted.

3. The element of claim 2 wherein $R_2$ is an unsubstituted hydroxyaryl group.

4. The element of claim 2 wherein $R_2$ is a hydroxyaryl group that is substituted with a cyclic imide group.

5. The element of claim 3 wherein said polymeric binder further comprises recurring units represented by Structure (Ib') in an amount of from 0 to about 60 mol %:

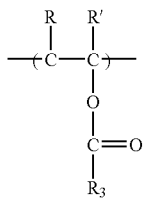

(Ib')

wherein $R_3$ is a hydroxyaryl group that is substituted with a cyclic imide group, and the amount of recurring units represented by Structures (Ib) and (Ib') comprise at least 20 mol %.

6. The element of claim 5 wherein the recurring units represented by Structure (Ia) are present at from about 2 to about 12 mol %, the recurring units represented by Structure (Ib) are present at from about 30 to about 60 mol %, the recurring units represented by Structure (Ib') are present at from about 20 to about 40 mol %, and the recurring units represented by Structure (Ic) are present at from about 10 to about 35 mol %, based on total recurring units, and the sum of the recurring units represented by Structures (Ib) and (Ib') are present at from about 60 to about 90 mol %.

7. The element of claim 5 wherein R and R' are independently hydrogen or methyl groups, $R_1$ is a substituted or unsubstituted alkyl group having 1 to 12 carbon atoms, and $R_2$ is a hydroxyphenyl group, and $R_3$ a hydroxyphenyl group having a substituted or unsubstituted phthalimide group.

8. The element of claim 1 wherein said polymeric binder is present at from about 40 to about 95 weight % based on the total dry weight of said imageable layer, and said radiation absorbing compound is an infrared radiation absorbing compound that is present at from about 0.1 to about 30 weight %, based on the total dry weight of the layer in which it is located.

9. The element of claim 1 further comprising a colorant dye or a UV- or visible-light sensitive component in said imageable layer, or both.

10. The element of claim 1 that can be used to provide a printed circuit board and comprises, under said imageable layer, an electrically conductive material over a non-conductive sub-layer.

11. The element of claim 1 further comprising a developability enhancing composition.

12. The element of claim 11 wherein said polymeric binder is present in an amount of from about 40 to about 95% and said infrared radiation absorbing compound is present in an amount of from about 1 to about 15 weight %.

13. A method of making an imaged element comprising:
A) imagewise exposing the positive-working imageable element of claim 1 to provide exposed and non-exposed regions, and
B) developing said imagewise exposed element to remove predominantly only said exposed regions.

14. The method of claim 13 wherein said imageable element is imaged at a wavelength of from about 700 to about 1200 nm to provide a lithographic printing plate having a hydrophilic aluminum-containing substrate.

15. The method of claim 13 wherein said polymeric binder comprises recurring units represented by the following Structures (Ia) through (Ic):

(Ia)

(Ib)

(Ic)

wherein the recurring units of Structure (Ia) are present at from 0 to about 22 mol %, the recurring units of Structure (Ib) are present at from about 20 to about 85 mol %, the recurring units of Structure (Ic) are present at from about 5 to about 40 mol %, based on total recurring units, R and R' are independently hydrogen or substituted or unsubstituted alkyl groups, substituted or unsubstituted cycloalkyl groups, or halo groups, $R_1$ is a substituted or unsubstituted alkyl group, a substituted or unsubstituted cycloalkyl group, or a substituted or unsubstituted aryl group other than a hydroxyaryl group, $R_2$ is a hydroxyaryl group that is optionally substituted.

16. The method of claim 15 wherein said polymeric binder further comprises recurring units represented by Structure (Ib') in an amount of from 0 to about 60 mol %:

(Ib')

wherein $R_3$ is a hydroxyaryl group that is substituted with a cyclic imide group, and the recurring units represented by Structures (Ib) and (Ib') are present in an amount of at least 20 mol %.

17. A polymer that comprises recurring units represented by the following Structures (Ia) through (Ic):

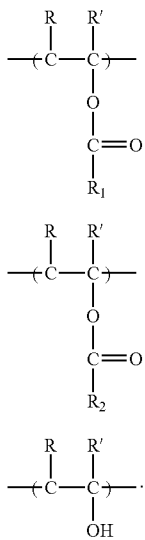

wherein the recurring units of Structure (Ia) are present at from 0 to about 22 mol %, the recurring units of Structure (Ib) are present at from about 0 to about 85 mol %, the recurring units of Structure (Ic) are present at from about 5 to about 40 mol %, provided that the recurring units represented by Structures (Ia) and (Ib) represent at least 20 mol %, based on total recurring units, R and R' are independently hydrogen or substituted or unsubstituted alkyl groups, substituted or unsubstituted cycloalkyl groups, or halo groups, $R_1$ is a substituted or unsubstituted alkyl group, a substituted or unsubstituted cycloalkyl group, or a substituted or unsubstituted aryl group other than a hydroxyaryl group, $R_2$ is a hydroxyaryl group that is optionally substituted.

18. The polymer of claim 17 further comprising recurring units represented by Structure (Ib') in an amount of from 0 to about 60 mol %:

wherein $R_3$ is a hydroxyaryl group that is substituted with a cyclic imide group, and the amount of recurring units represented by Structures (Ib) and (Ib') comprise at least 20 mol %.

* * * * *